(12) United States Patent
Christensen

(10) Patent No.: US 10,942,661 B2
(45) Date of Patent: *Mar. 9, 2021

(54) NON-VOLATILE MEMORY INCLUDING SELECTIVE ERROR CORRECTION

(71) Applicant: Micron Technology, Inc., Boise, ID (US)

(72) Inventor: Carla L. Christensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 143 days.

This patent is subject to a terminal disclaimer.

(21) Appl. No.: 16/196,304

(22) Filed: Nov. 20, 2018

(65) Prior Publication Data

US 2019/0087267 A1 Mar. 21, 2019

Related U.S. Application Data

(63) Continuation of application No. 14/997,164, filed on Jan. 15, 2016, now Pat. No. 10,169,144.

(51) Int. Cl.
*G06F 11/10* (2006.01)
*G06F 3/06* (2006.01)
*G11C 11/00* (2006.01)
*G11C 29/04* (2006.01)

(52) U.S. Cl.
CPC ............ *G06F 3/064* (2013.01); *G06F 3/0619* (2013.01); *G06F 3/0659* (2013.01); *G06F 3/0688* (2013.01); *G06F 11/1068* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 6,209,110 B1 * | 3/2001 | Chhor | G06F 11/006 714/718 |
| 8,245,101 B2 | 8/2012 | Olbrich et al. | |
| 8,527,837 B2 * | 9/2013 | Furno | G06F 11/1068 714/763 |
| 8,839,032 B2 * | 9/2014 | Walton | G06F 11/0712 709/224 |
| 9,626,286 B2 | 4/2017 | Gorobets | |
| 9,703,633 B2 * | 7/2017 | Zhang | H03M 13/2942 |

(Continued)

*Primary Examiner* — Phung M Chung
(74) *Attorney, Agent, or Firm* — Schwegman Lundberg & Woessner, P. A.

(57) ABSTRACT

Some embodiments include apparatuses and methods using a first memory area and a second memory area included a memory device, and using control circuitry included in the memory device to communicate with a memory controller. The memory controller includes an error correction engine. The control circuitry of the memory device is configured to retrieve the first information from the first memory area and store in the first information after the error correction engine performs an error detection operation on the first information. The control circuitry is configured to retrieve second information from the first memory area and store the second information in the second memory area without an additional error detection operation performed on the second information if a result from the error detection operation performed by the error correction engine on the first information meets a threshold condition.

20 Claims, 9 Drawing Sheets

(56) References Cited

U.S. PATENT DOCUMENTS

| | | | | |
|---|---|---|---|---|
| 9,841,910 | B2* | 12/2017 | Jain | ........................ G06F 3/0619 |
| 10,169,144 | B2* | 1/2019 | Christensen | .......... G06F 3/0619 |
| 2004/0010742 | A1 | 1/2004 | Williamson et al. | |
| 2017/0206131 | A1 | 7/2017 | Christensen | |

* cited by examiner

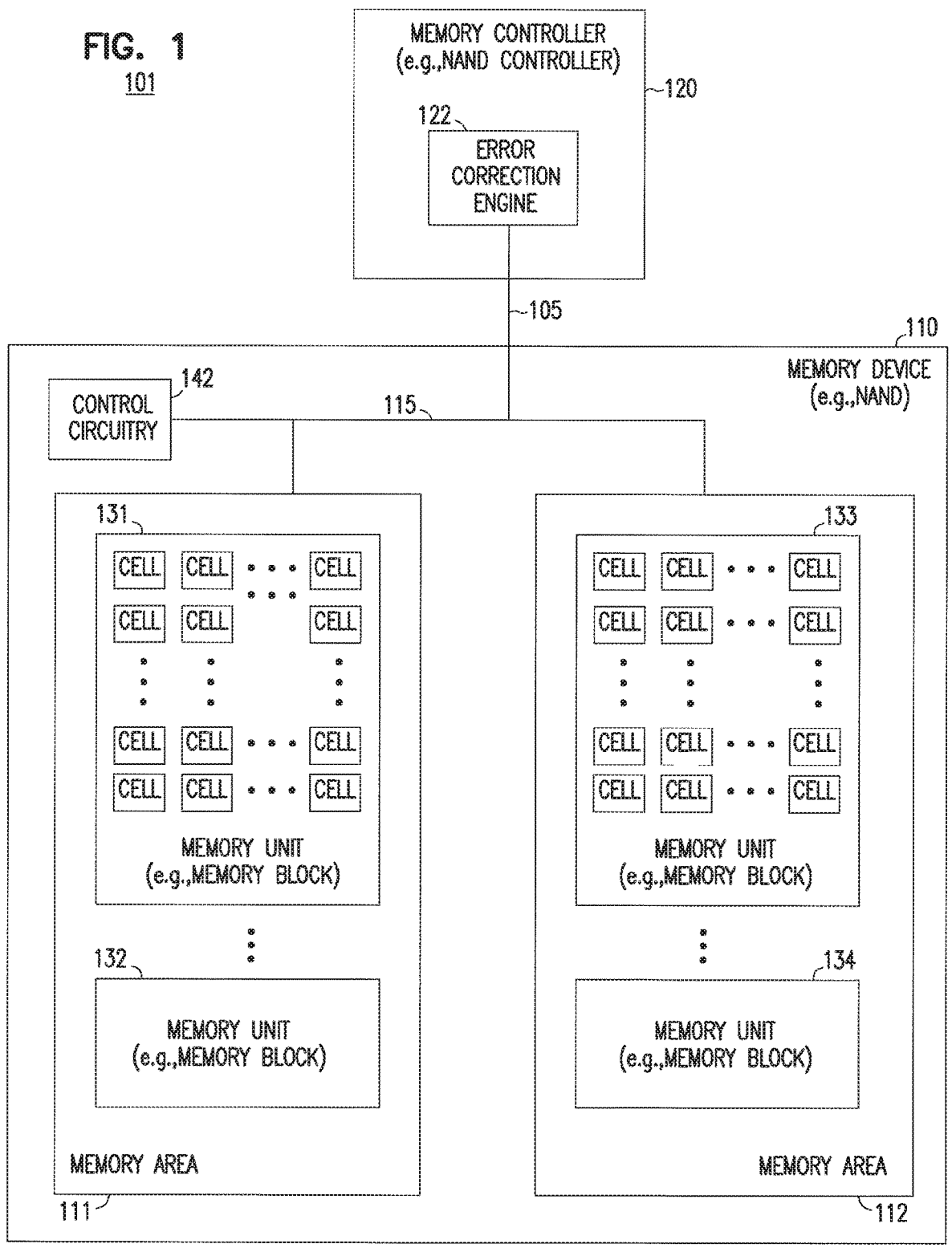

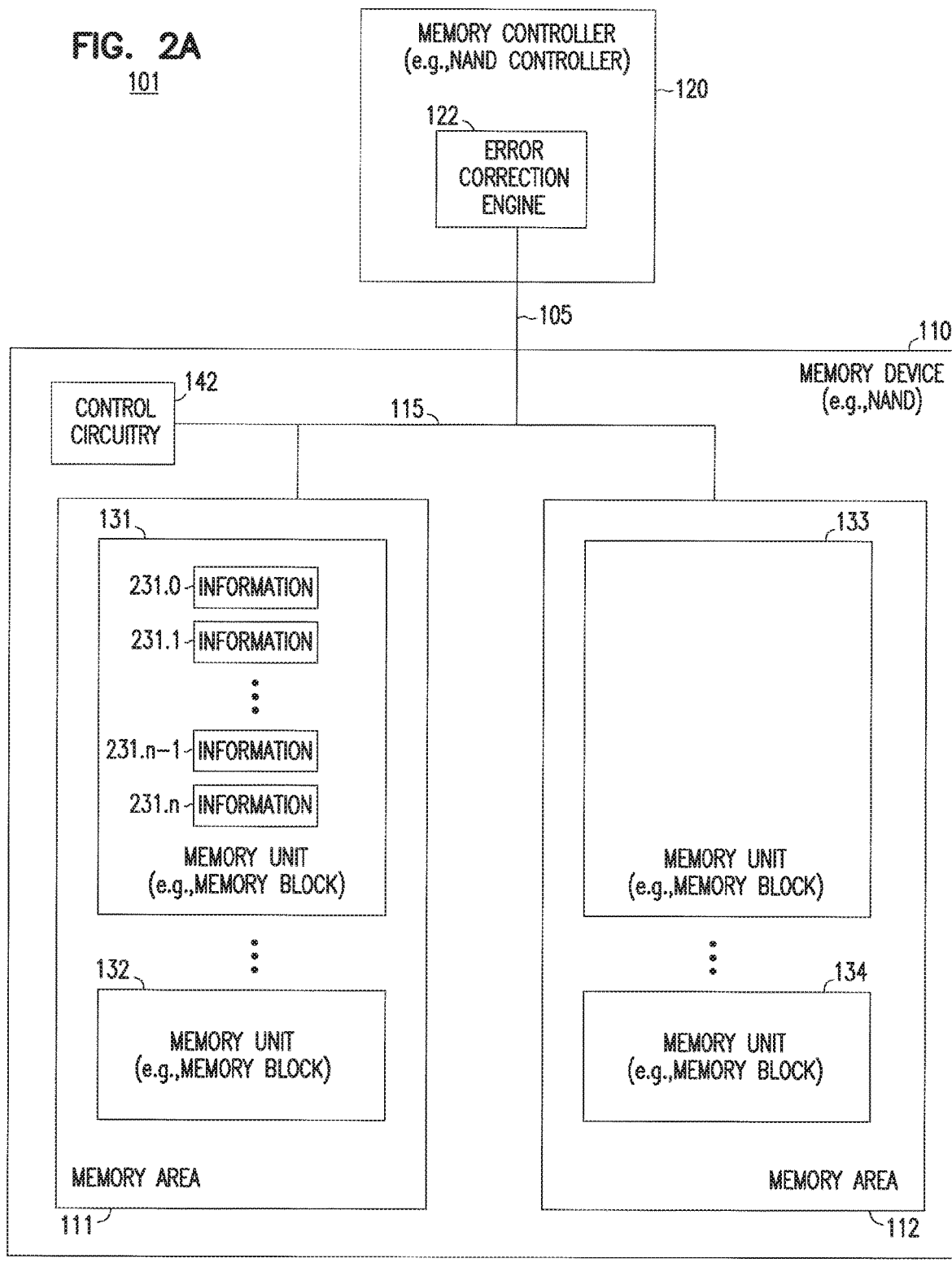

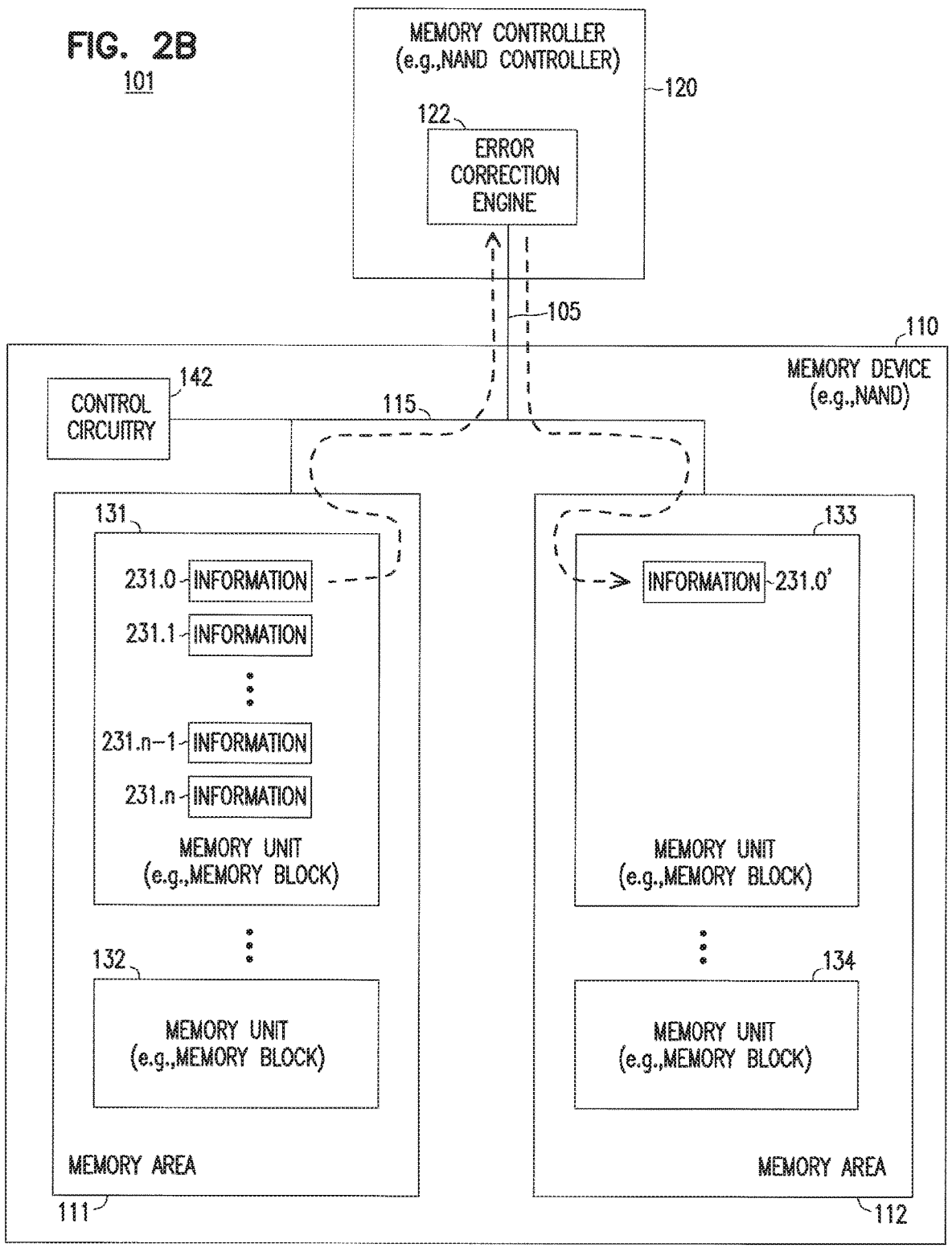

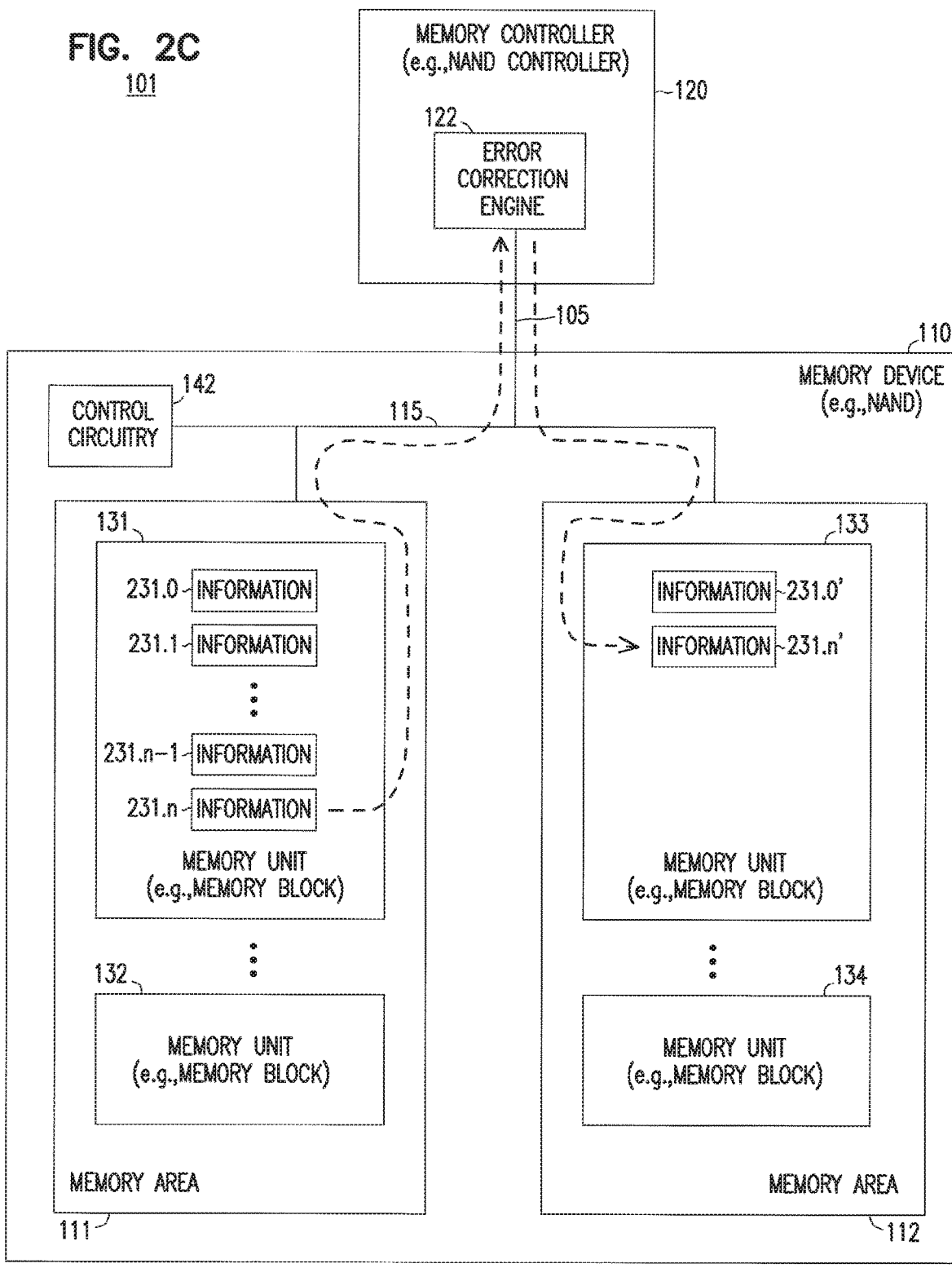

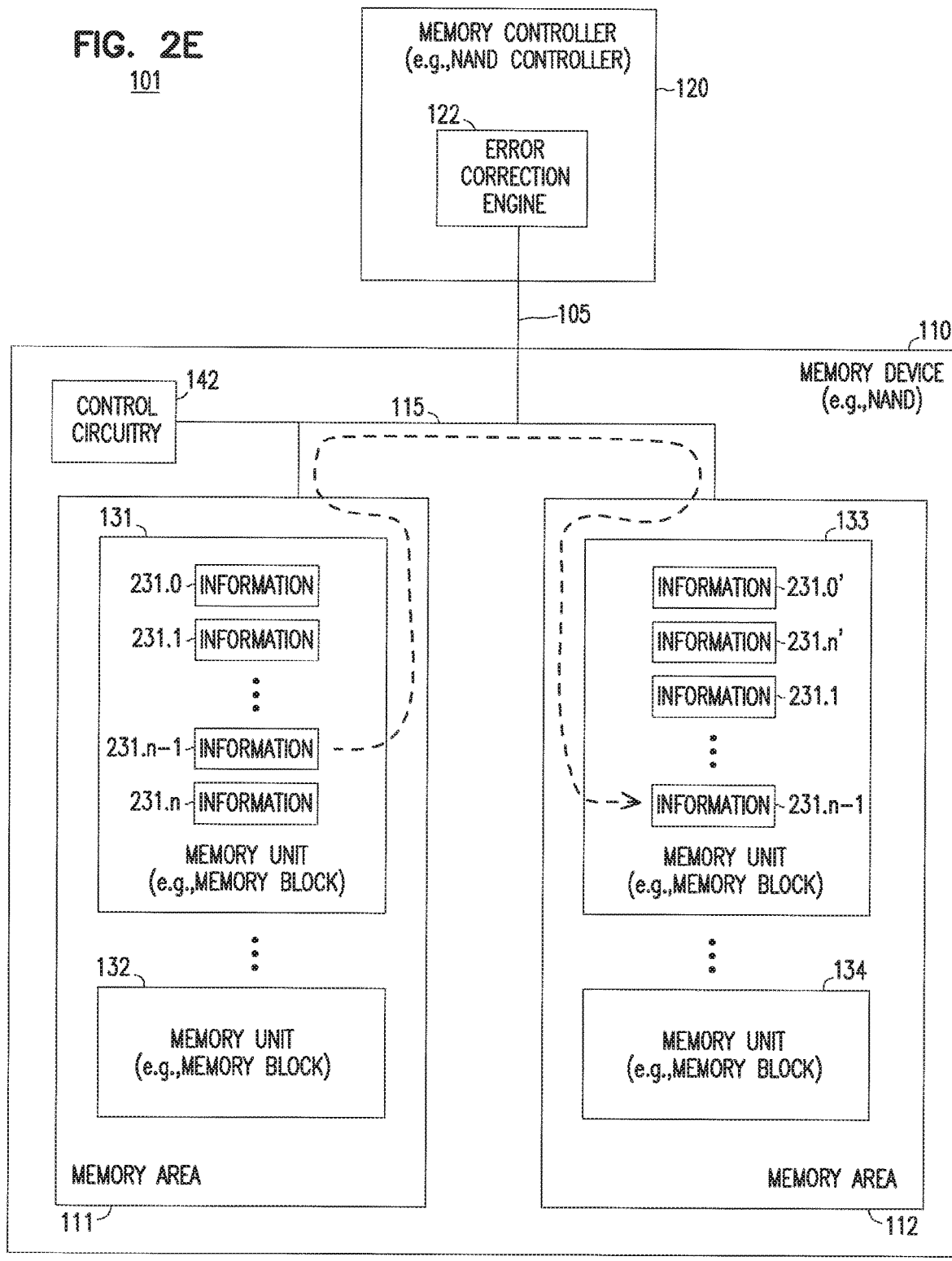

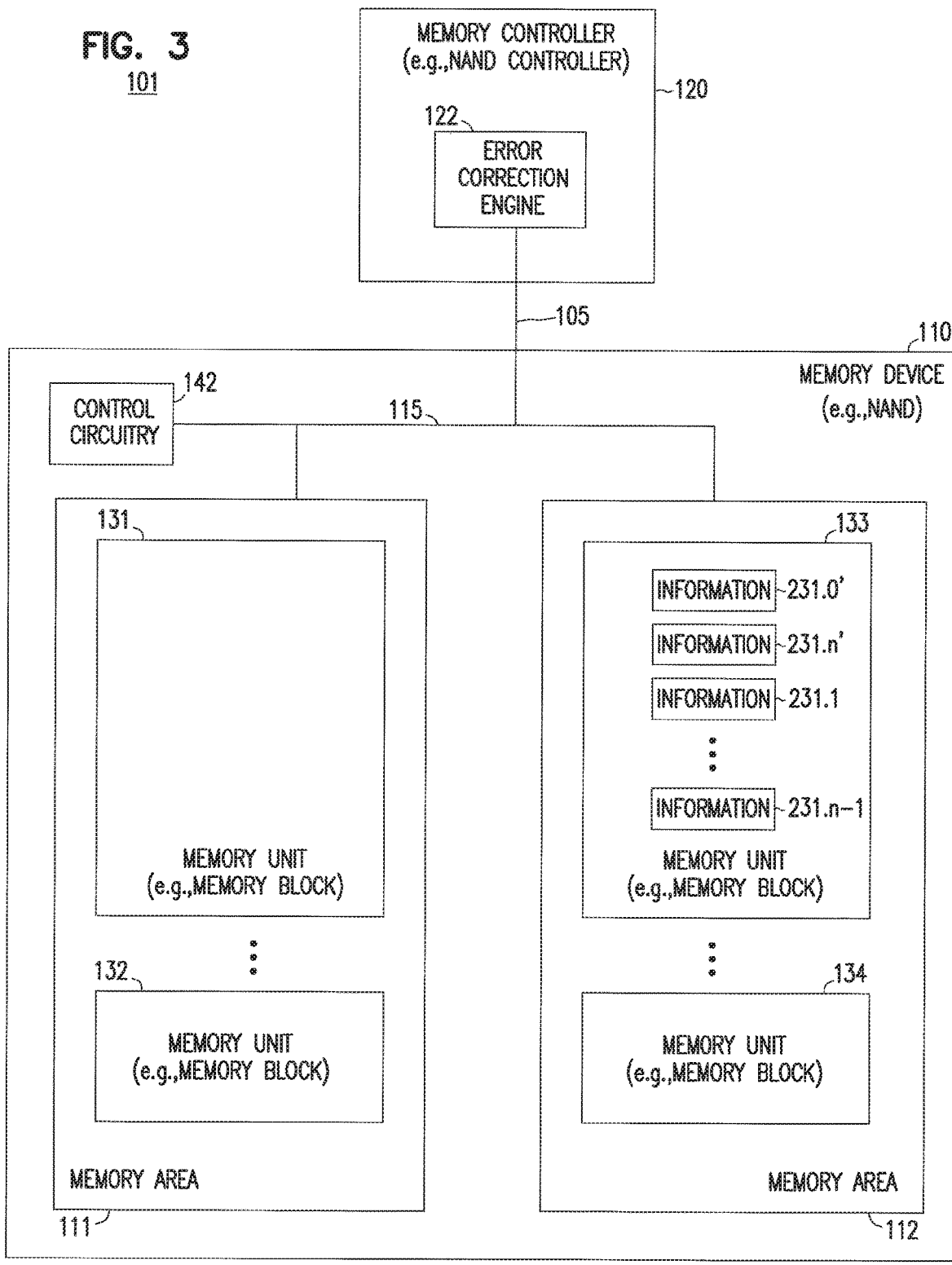

NON-VOLATILE MEMORY INCLUDING SELECTIVE ERROR CORRECTION

PRIORITY APPLICATION

This application is a continuation of U.S. application Ser. No. 14/997,164, filed Jan. 15, 2016, which is incorporated herein by reference in its entirety.

BACKGROUND

Many electronic systems, such as desktop and laptop computers, servers, cellular phones, and other electronic devices or systems, have a memory device to store information (e.g., data). Some memory devices have a memory management operation to maintain reliability and prolong the life expectancy of the memory device. The memory management operation usually involves moving information from one location in the memory device to another location in the memory device. In some conventional memory devices, moving information during such a memory management operation may be time consuming and increase power consumption.

BRIEF DESCRIPTION OF THE DRAWINGS

FIG. 1 is a block diagram of an apparatus in the form of a memory module including a memory device, memory controller, and a connection, according to some embodiments described herein.

FIG. 2A is a block diagram of the memory module of FIG. 1 including information stored in a memory area of a memory device of the memory module, according to some embodiments described herein.

FIG. 2B through FIG. 2E show examples of moving information during a memory management operation in the memory module of FIG. 2A, according to some embodiments described herein.

FIG. 3 shows an example of the memory device of FIG. 2A after information stored in a memory unit (e.g., a memory block) of the memory device is removed, according to some embodiments described herein.

DETAILED DESCRIPTION

Figure 2D:
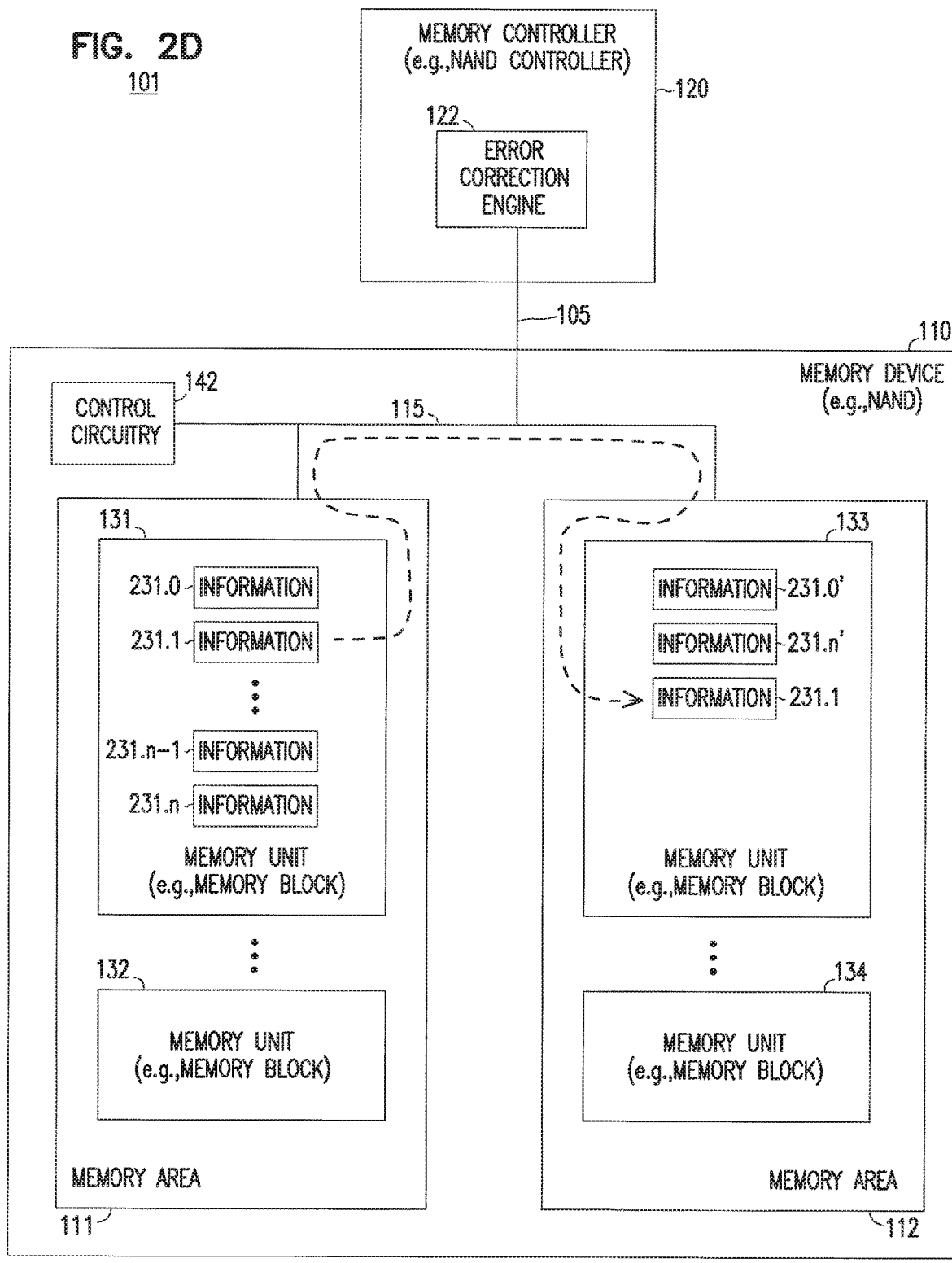

The techniques described herein include a memory module to store information in an electric device or system. The memory module can perform a memory management operation. Examples of the memory management operation are a garbage collection operation, a wear-leveling operation, and other memory operations. The memory management operation includes moving information within the memory module. Moving information involves retrieving information already stored in one memory area of the memory module and then storing that information in another memory area of the memory module.

The memory module described herein can also perform an error correction operation to correct errors that may occur in information stored in the memory module. The memory module includes techniques to determine whether error correction is needed to be performed on information stored in a memory area of the memory module before the information is moved to another memory area of the memory module during a memory management operation. Thus, in some situations during a memory management operation, the memory module may skip performing error correction to particular information if a certain threshold condition (e.g., a pre-determined threshold condition) is met for that particular information.

As described in more detail below, the memory module includes sampling techniques to determine whether a certain threshold condition is met for particular information that is to be moved during a memory management operation. The sampling techniques include checking the integrity of only a portion the information before the entire information is moved. Based on the sampling of particular information, the memory module can determine whether a certain threshold condition is met for particular information. If the threshold condition is not met, the memory module may perform error correction to the entire information before moving it. If the threshold condition is met, the memory module may move the entire information without performing the error correction to the information. Thus, the techniques described herein selectively perform error correction on information to be moved during a memory management operation. This may save operational time and power consumption in the memory module.

FIG. 1 is a block diagram of an apparatus in the form of a memory module 101 including a memory device 110, memory controller 120, and a connection 105, according to some embodiments described herein. Memory module 101 can be used to store information in a computer, memory storage system, or other electronic devices or system. Memory module 101 can be incorporated (e.g., located on a circuit board) in an electronic device or system. Alternatively, memory module 101 can include a solid state drive (SSD).

Memory device 110 included in memory module 101 can include memory areas (e.g., memory arrays) 111 and 112. Each of memory areas 111 and 112 can be included in (e.g., formed in or formed on) a single die or in multiple dice. The die can be included in an integrated circuit (IC) chip (e.g., a semiconductor chip).

Each of memory areas 111 and 112 has memory cells (each of the memory cells is labeled as "CELL"). The memory cells in memory area 111 can be included in (e.g., formed in or formed on) the die (or dice) in memory area 111. The memory cells in memory area 112 can be included in (e.g., formed in or formed on) the die (or dice) in memory area 112.

The memory cells in each of memory areas 111 and 112 can be arranged in rows and columns in memory units. Each of the memory units can include or can be a block of memory cells. As shown in FIG. 1, for example, memory area 111 can include a memory unit 131 (e.g., a block of memory cells) and a memory unit (e.g., a block of memory cells) 132. Memory area 112 can include a memory unit 133 (e.g., a block of memory cells) and a memory unit (e.g., a block of memory cells) 134. The number of memory units between memory areas 111 and 112 can be the same or can be different. Each of the memory units within each of memory areas 111 and 112 can be identified by a unique identification (e.g., a unique address). The unique identification associated with a particular memory unit can be used to access (e.g., during a read or write operation) that particular unit. In a particular memory unit (e.g., 131), information can be stored in (or retrieved from) portion of the memory cells (e.g., fewer than all of the memory cells)

in that memory unit (e.g., 131). However, for any individual memory unit (e.g., 131), if any portion of the information stored in the memory cells in that particular memory unit (e.g., 131) is erased, then all information in the memory unit is concurrently erased. Thus, a memory unit (e.g., one of 131, 132, 133, and 134) in memory areas 111 and 112 can be a smallest erasable portion of memory cells in memory areas 111 and 112 that can be concurrently erased.

The memory cells in memory areas 111 and 112 can include non-volatile memory cells. Examples of non-volatile memory cells include flash memory cells, phase change memory cells, ferroelectric random-access memory (FeRAM) cells, magnetoresistive random-access memory (MRAM) cells, resistive random-access memory (RRAM) cells, spin-transfer torque memory cells, or other types of non-volatile memory cells. The memory cells in memory areas 111 and 112 can be arranged in a NAND-type memory arrangement.

Each of the memory cells in memory areas 111 and 112 can be configured as either a single-level cell (SLC) or multiple-level memory cell. A single-level cell can store at most one (e.g., only one) bit of information. A multiple-level memory cell can store up to multiple bits of information. For example, each of the memory cells in memory area 111 can be configured as a single-level cell to store at most one bit of information. Each of the memory cells in memory area 112 can be configured as a multi-level cell (MLC) to store at most two bits (up to two bits) of information, a triple-level cell (TLC) to store at most three bits (up to three bits) of information, or another configuration to store more than three bits of information. In another example, each of the memory cells in memory area 111 can be configured to store at least one bit of information (e.g., one bit of information or multiple bits of information), and each of the memory cells in memory area 112 can be configured to store more than one bit of information.

Memory device 110 can include control circuitry 142 to control operations within memory device 110. Control circuitry 142 can be configured (e.g., structured) by hardware, firmware, software, or any combination of hardware, firmware, and software to perform operations described herein. Although not shown in FIG. 1, control circuitry 142 can include decoders, registers, state machines, latches, drivers, read-only-memory (ROM), and any associated instruction codes (e.g., algorithms) retained temporarily or permanently in computer-readable memory structures, and other components, to perform the operations described herein.

Memory device 110 can receive different control information (e.g., different commands) from memory controller 120 to perform different operations. For example, memory device 110 can receive write, read, and memory management commands from memory controller 120 to perform write, read, and memory management operations, respectively. A write operation includes storing information in memory device 110 in which the information may be provided to memory module 101 by a host (not shown). A read operation includes retrieving information from memory device 110 and the providing the retrieved information to the host. A memory management operation includes moving information (which is already stored in memory device 110) in from one location (e.g., memory area 111) within memory module 101 to another location (e.g., memory area 112) within memory module 101.

As shown in FIG. 1, memory device 110 can include conductive path 115 coupled to memory areas 111 and 112 and control circuitry 142. Conductive path 115 can include a bus (e.g., an internal bus) used to carry information within memory device 110 without going through connection 105 and without going through memory controller 120. As shown in FIG. 1, memory areas 111 and 112 are include in the same memory device 110 and are selectively coupled to each other through conductive path 115 in memory device 110, in most cases through operation of the memory management function.

Memory controller 120 can be included in (e.g., formed in or formed on) the same die as memory device 110. Alternatively, memory controller 120 can be included in a die separated from the die (or dice) where memory device 110 is included. Memory controller 120 can include an embedded multi-media memory controller (eMMC), which can be a NAND controller or another type of memory controller.

Memory controller 120 can communicate with a host (not shown) during write operation (e.g., based on write command sent by the host to memory controller 120) to receive information (e.g., host data) from the host and store the received information in memory device 110. Memory controller 120 can also communicate with the host during a read operation (e.g., based on a read command sent by the host to memory controller 120) to retrieve information (e.g., host data) from memory device 110 and provide retrieved information to the host Memory controller 120 can also be configured with a combination of hardware, firmware, and software in order to determine whether information needs to be corrected before storing that information in another memory area during a memory management operation to move information within memory device 110, without receiving a command (e.g., a read or write command) from the host.

Memory controller 120 and memory device 110 and can communicate (e.g., exchange information) with each other through connection 105. Connection 105 can include conductive paths that are included in (e.g., conductive paths formed in or formed on) the die where memory controller 120 and at least part of memory device 110 (e.g., only a portion of or the entire memory device 110) are located. Alternatively, connection 105 can include conductive traces on a circuit board where memory device 110 and memory controller 120 are located.

As shown in FIG. 1, memory controller 120 can include an error correction engine 122, which can be used to perform error correction operation on information stored in memory device 110. Error correction engine 122 can be configured to detect single bit error or multiple bit errors and correct single bit or multiple bit errors. During a memory management operation in memory module 101, memory controller 120 can use (e.g., cause) error correction engine 122 to perform an operation (e.g., error detection) on the information stored in memory device 110 to detect whether the information has an error. Error correction engine 122 can correct the error if it is detected. FIG. 1 shows error correction engine 122 being located in memory controller 120 as an example. In an alternative arrangement, error correction engine 122 can be located in memory device 110.

Moving information during a memory management operation in memory module 101 includes performing a read operation to retrieve particular information from one memory area (e.g., 111) of memory device 110, and then performing a write operation to store that particular information in another memory area (e.g., 112) of memory device 110. The read and write operations during the memory management operation are internal operations to move information within memory module 101. Thus, the read and write operations during the memory management operation can be initiated by memory module 101 without receiving a read or write command from a host to perform the memory management operation. Either memory controller 120 or memory device 110 can initiate the memory management operation.

As described above, the memory cells in memory area 111 can be configured as single-level cells. The memory cells in memory area 111 can be configured as multiple-level cells. Thus, the memory cells in memory area 111 may operate at higher speed than the memory cells in memory area 112. Plus, as is known to those skilled in the art, a threshold voltage range for a bit of information stored in a single-level memory cell is usually greater than a threshold voltage range for a bit of information stored in a multiple-level memory cell. Thus, information stored in single-level memory cells is may be more reliable (have a lower error rate) than information stored in multiple-level memory cells. Therefore, memory area 111 (which may have a higher operating speed than memory area 112) may be configured as a cache memory in memory module 101 to initially store information (e.g., host data). Then, the information stored in memory area 111 can be moved to memory area 112 (which has a higher storage capacity) during the memory management operation of memory module 101. Initially storing information in memory area 111 and then moving the information to memory area 112 allows an efficient use of memory module 101 (e.g., reduced latency in storing information (e.g., host data) in memory device 110). It also allows both configurations of memory (single-level and multiple-level cell memory) to be used in memory module 101 and provide the benefits of each to the system.

One of ordinary skill in the art may recognize that a memory module such as memory module 101 may include other elements, several of which are not shown in FIG. 1, so as not to obscure the example embodiments described herein.

FIG. 2A is a block diagram of memory module 101 including information stored in memory area 111 of memory device 110, according to some embodiments described herein. FIG. 2A shows an example where information (INFO) 231.0, 231.1, 231.*n*–1, and 231.*n* has been stored in memory unit 131 of memory area 111 in different portions of the memory cells in memory unit 131. For example, information 231.0, 231.1, 231.*n*–1, and 231.*n* can be respectively stored in four different groups of memory cells in memory unit 131.

Information stored in each of memory units 131 and 132 can be organized into pages of information. Each of the pages of information includes a number of bits in which each of the bits can have a binary value (e.g., either binary 0 or binary 1). The number of bits in a page can be stored in a certain group of memory cells. For example, memory unit 131 can be a block of memory cells and information 231.0, 231.1, 231.*n*–1, and 231.*n* can be associated with four pages stored four respective groups of memory cells in the block of memory cells. FIG. 2A shows an example of only four information 231.0, 231.1, 231.*n*–1, and 231.*n* associated with four pages (e.g., page.0, page.1, page.n–1, and page.n) among the pages stored in memory unit 131. Any number of pages may be stored in memory unit 131, consistent with the capacity of the memory device. For example, memory unit 131 can store 256 pages (e.g., page.0 through page.255), where information 231.0, 231.1, 231.*n*–1, and 231.*n* can be associated with four of the 256 pages. In any examples, the number of pages stored in memory unit 131 can be proportional to the size of (e.g., the number of memory cells) memory unit 131.

Thus, as described above in the example of FIG. 2A, each of information 231.0, 231.1, 231.*n*–1 and 231.*n* can be stored in a respective group of memory cells of memory unit 131; and each information 231.0, 231.1, 231.*n*–1 and 231.*n* can be associated with a separate respective page (for example, page.0, page.1, page.n–1 and page.n) of the pages stored in memory unit 131.

In some embodiments, different information can be stored in each of memory units 131 and 132 of memory area 111 at different times; which in other embodiments, the different information can be stored in memory units 131 and 132 concurrently. As an example of storage at different times, information 231.0, 231.1, 231.*n*–1, and 231.*n* can each be stored (e.g., sequentially stored) in memory unit 131 at different times. As an example, information 231.0 can be stored (e.g., oldest page) before all other pages are stored in memory unit 131. Information 231.*n* (e.g., newest page) can be stored in memory unit 131 after all other pages are stored in memory unit 131. In the concurrent storage alternative, multiple pages can be concurrently stored in different portions of memory cells in memory unit 131. For example, information 231.0 and information 231.1 can be stored concurrently (e.g., stored at the same time) in two different groups of memory cells in memory unit 131.

FIG. 2B through FIG. 2E show examples of moving information during a memory management operation in memory module 101, according to some embodiments described herein. The memory management operation associated with FIG. 2B through FIG. 2E samples a portion of information stored in memory unit 131 and performs an operation (e.g., error detection operation) on the sampled portion. Sampling a portion of information stored in memory unit 131 includes retrieving fewer than all pages (e.g., fewer than all of information 231.0, 231.1 231.*n*–1, and 231.*n*, in the present example) stored in memory unit 131. Thus, the operation (e.g., error detection operation) performed on the sampled portion is performed on fewer than all pages stored in memory unit 131.

Based on the result of the operation on sampled portion, the memory management operation determines whether to perform error correction on the entire information (or alternatively, the rest of the information) stored in memory unit 131 before moving the information to another memory unit in memory area 112. Thus, error correction may or may not be performed on information stored in memory unit 131 before the information is moved. For example, if the result of the operation on the sampled portion has one value (e.g., the result indicates a certain pre-determined threshold condition is not met), then error correction may be performed on the information (in order to correct an error in the information) stored in memory unit 131 before the information is moved. If the result of the operation on the sampled portion has another value (e.g., the result indicates a certain pre-determined threshold condition is met), then error correction may be skipped. In this case, the information stored in memory unit 131 can be moved to memory area 112 without the error correction being performed on the information stored in memory unit 131.

As shown in FIG. 2B, memory device 110 can retrieve information 231.0 from memory unit 131 and provide information 231.0 to memory controller 120 through connection 105. Memory controller 120 can receive information 231.0 and use error correction engine 122 to perform an operation (e.g., an error detection operation) on information 231.0 to determine whether information 231.0 has an error. A particular information (e.g., 231.0) is determined to have an error if that particular has a single erroneous bit or multiple erroneous bits. In FIG. 2B, if the error is detected in information 231.0 by error correction engine 105, memory controller 120 can determine the number (quantity) of erroneous bits in information 231.0. Memory controller 120 can also use error correction engine 122 to perform an operation (e.g., an error correction operation) on information 231.0 to correct the error if the error is detected in information 231.0. In some cases, error correction engine 122 may be used to correct any bit error detected; or alternatively may be used to correct only certain types or certain multiples of detected bit errors.

The error detection, correction, or both, performed on a particular information (e.g., information 231.0) associated with FIG. 2B through FIG. 2E can include decoding and encoding that particular information. In FIG. 2B, after performing the operation (e.g., detection, correction, or both) on information 231.0, memory controller 120 provides information 231.0' to memory device 110 through connection 105. Memory device 110 receives information 231.0' and stores it in memory unit 131 of memory area 112.

The value of information 231.0' provided by memory controller 120 is based on the value of information 231.0. For example, if no error is detected in information 231.0, then information 231.0' can have the same value as information 231.0. If an error is detected in information 231.0, then information 231.0' can have a corrected value of information 231.0. The corrected value of information 231.0 is the original value of information 231.0 (before the occurrence of the error).

In FIG. 2C, the operations of memory device 110 and memory controller 120 are similar to the operations associated with FIG. 2B except that a different portion of information (e.g., a different page) stored in memory unit 131 is sampled (e.g., checked). As shown in FIG. 2C, memory controller 120 can receive information 231.n and use error correction engine 122 to perform an operation (e.g., an error detection operation) on information 231.n to determine whether information 231.n has an error. If the error is detected in information 231.n, memory controller 120 can determine the number (quantity) of erroneous bits in information 231.n. Memory controller 120 can also use error correction engine 122 to perform an operation (e.g., an error correction operation) on information 231.n to correct the error if the error is detected in information 231.n.

After performing the operation (e.g., detection, correction, or both) on information 231.n, memory controller 120 provides information 231.n' to memory device 110 through connection 105. Memory device 110 receives information 231.n' and stores it in memory unit 131 of memory area 112.

The value of information 231.n' provided by memory controller 120 is based on the value of information 231.n. For example, if no error is detected in information 231.n, then information 231.n' can have the same value as information 231.n. If an error is detected in information 231.n, then information 231.n' can have a corrected value of information 231.n. The corrected value of information 231.n is the original value of information 231.n (before the occurrence of the error).

As shown in FIG. 2C, if the error is detected in information 231.n, memory controller 120 can determine the number (quantity) of erroneous bits, which is the number of particular bits (among bits included in information 231.n) that have the error.

Memory controller 120 can compare the number of erroneous bits in each of information 231.0 and 231.n with a threshold value (e.g., a predetermined value). Based on the comparison, memory controller 120 can determine whether the number of erroneous bits in each of information 231.0 and 231.n is greater than the threshold value. The threshold value can be programmable in memory module 101. The threshold value may be changed during the life of memory module 101. For example, the threshold value may be set at a lower value when memory module 101 is initially used (e.g., new memory module 101). Then, the threshold value may be changed (e.g., automatically changed by memory module 101) to a higher value as time goes on in the use of the memory module 101.

Based on whether the result of the comparison meets a threshold condition, memory device 110 and memory controller 120 can either perform (e.g., apply) the error detection and corrections on the rest of information stored in 131 or skip (not apply) the error detection and corrections for the rest of information stored in 131. In some examples, the threshold condition may simply be a number of errors. For example, if the threshold condition is set at E bits, where E is an integer (e.g., E=4), and if the number of detected error bits in each of information 231.0 and 231.n is not greater than E (e.g., 4 bits or fewer), then error detection and correction on the rest of information stored in memory unit 131 will be skipped.

Thus, in the above examples, if the number of erroneous bits is greater than the threshold value (e.g., a pre-determined threshold condition is not met), then memory device 110 and memory controller 120 can perform the error detection and corrections on the rest of information stored in 131. In this example, then memory device 110 and memory controller 120 can move rest of the information (e.g., 231.1 and 231.n−1) from memory area 111 to memory are 111 in ways similar to the operations for information 231.0 and information 231.n, as described above. For example, memory device 110 and memory controller 120 perform the error detection (and error correction if needed) on the rest of the information (e.g., 231.1 and 231.n−1) in memory area 111 before storing the rest of information from memory area 111 in memory area 112

In another example, if the number of erroneous bits is not greater than the threshold value, which also means that the number of erroneous bits is less than or equal to the threshold value, (e.g., a pre-determined threshold condition is not met), then memory device 110 and memory controller 120 can skip the error detection and corrections for the rest of information stored in 131. In this example, rest of information (e.g., 231.1 and 231.n−1) stored in memory unit 131 can be moved directly from memory area 111 to memory area 112 without providing the rest of information to memory controller 120.

If the number of erroneous bits is not greater than the threshold value after the operation (e.g., error detection, error correction, or both) performed on information 231.0 and information 231.n, memory controller 120 may generate an indication (e.g., a "bypass" command) and provide such an indication to memory device 110. The indication allows memory device 110 to directly move the rest of information from memory unit 131 to memory area 112 without providing the rest of the information from memory unit 131 to memory controller 120 (e.g., bypassing memory controller 120).

The description associated with FIG. 2D and FIG. 2E describes example operations of memory device 110 and memory controller 120 where the number of erroneous bits is not greater than the threshold value (i.e., the number of erroneous bits less than or equal to the threshold value). Thus, as shown in FIG. 2D and FIG. 2E, information (e.g., 231.1 and 231.n−1) can be moved directly from memory area 111 to memory area 112 without providing the rest of information to memory controller 120.

In FIG. 2D, memory device 110 can retrieve information 231.1 from memory unit 131, then store information 231.1 in memory unit 133 of memory area 112 without providing information 231.1 to memory controller 120. Thus, as shown in FIG. 2D, information 231.1 goes through conductive path 115 between memory areas 111 and 112 without going through connection 105.

In FIG. 2E, memory device 110 can retrieve information 231.$n$−1 from memory unit 131 and then store information 231.$n$−1 in memory unit 133 of memory area 112 without providing information 231.$n$−1 to memory controller 120. Thus, as shown in FIG. 2E, information 231.1 goes through conductive path 115 between memory areas 111 and 112 without going through connection 105.

Thus, as described above, if a result from the error detection operation meets a threshold condition (e.g., if the number of erroneous bits each of information 231.0 and 231.$n$ is at not greater than the threshold value), memory device 110 can retrieve information 231.1 and 231.$n$−1 and store them directly in memory area 112 without an error detection operation (and without an error correction) performed on information 231.1 and 231.$n$−1.

In the description associated with FIG. 2D and FIG. 2E, information 231.0', 231.$n$', 231.1, and 231.$n$−1 may be stored in memory unit 133 in a different way from memory unit 131. For example, if each of each of memory cells in memory area 112 is configured to store up to two bits of information, then two bits from two different pages can be stored in the same memory cell (e.g., single memory cell) of memory unit 133. Thus, two different pages of information can be stored in the same portion (e.g., same group) of memory cells in memory unit 133. For example, in FIG. 2E, two of information 231.0', 231.$n$', 231.1, and 231.$n$−1 (e.g., 231.0' and 231.$n$') can be stored in the same group of memory cells in memory unit 133. In another example, if each of each of memory cells in memory area 112 is configured to store up to three bits of information, then three bits from three different pages can be stored in the same memory cell (e.g., single memory cell) of memory unit 133. Thus, three different pages of information can be stored in the same portion (e.g., same group) of memory cells in memory unit 133. For example, in FIG. 2E, three of information 231.0', 231.$n$', 231.1, and 231.$n$−1 (e.g., 231.0', 231.$n$', and 231.1,) can be stored in the same group of memory cells in memory unit 133.

In the above description, with reference to FIG. 2A through FIG. 2E, the oldest information (e.g., 231.0) and the newest information (e.g., two pages) are sampled as an example. However, other portions of information stored in memory unit 131 may be sampled. Further, as described with reference to FIG. 2A through FIG. 2E, only two pages are sampled, however, another number of pages can be used for sampling.

FIG. 3 shows an example of memory device 110 after information stored in memory unit 131 is removed, according to some embodiments described herein. In the example of FIG. 3, memory device 110 may perform an erase operation to erase (e.g., concurrently erase) information 231.0, 231.1, 231.$n$−1, and 231.$n$ from memory unit 131. The erase operation can be part of (e.g., at the end of) the memory management operation described above with reference to FIG. 2A through FIG. 2E.

Figure 4:
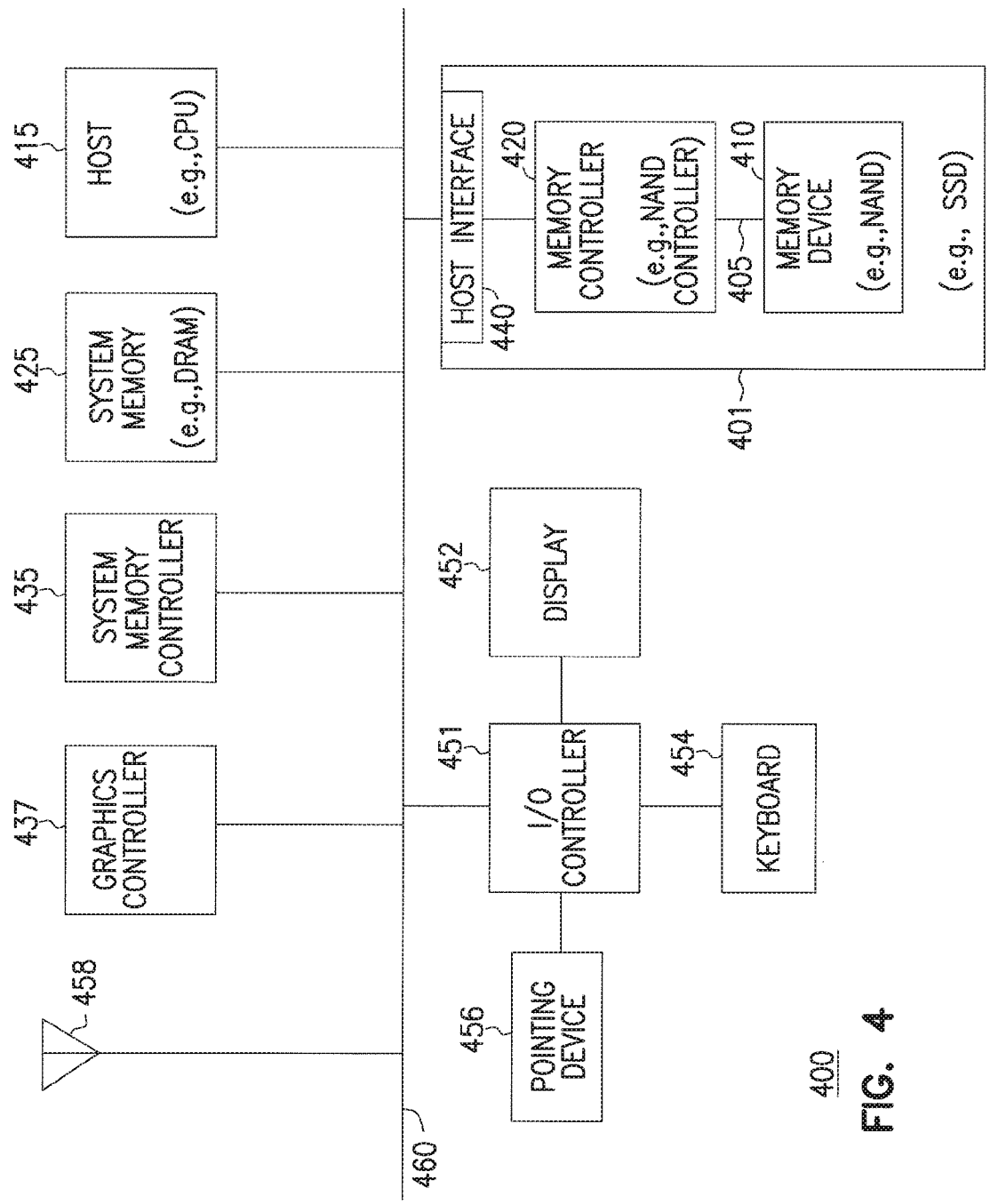
FIG. 4 is a block diagram of an apparatus in the form of a system (e.g., electronic system) including a memory module, according to some embodiments described herein.

FIG. 4 is a block diagram of an apparatus in the form of a system (e.g., electronic system) 400, according to some embodiments described herein. System 400 can include or be included in a computer, a memory storage system, or other types of electronic systems. As shown in FIG. 4, system 400 can include a memory module 401 (which can include an SSD), a host 415, a system memory 425, a system memory controller 435, a graphics controller 437, an input and output (I/O) controller 451, a display 452, a keyboard 454, a pointing device 456, at least one antenna 458, and a bus 460.

As shown in FIG. 4, memory module 401 can include a memory device 410 and a memory controller 420 and a connection 405, which can correspond to memory device 110, memory controller 120, connection 105, respectively, of FIG. 1. Memory module 401 can be configured to operate in ways similar to, or the same as, memory module 101 of FIG. 1.

Memory module 401 can also include a host interface 440 to communicate with host 415. Host interface 440 can include components (e.g., connectors and circuitry) that comply with Peripheral Component Interconnect Express (PCIe) specification. Serial Advanced Technology Attachment (SATA) specification. Serial Attached Small Computer System Interface (SAS) specification, InfiniBand specification, Ethernet specification, Fibre Channel specification, or other specifications. Thus, host interface 440 can include a connector having a form factor (e.g., physical dimension and conductive terminals) complying with PCIe. SATA, SAS, InfiniBand, Ethernet (e.g., 10G/40G/100G Ethernet). Fibre Channel, or other specifications.

Host 415 may include a central processing unit (CPU), which can be part of a general-purpose processor or part of an application specific integrated circuit (ASIC). System memory 425 may include a dynamic random access memory (DRAM) device, a static random access memory (SRAM) device, a flash memory device, or a combination of these memory devices. I/O controller 451 can include a communication memory module for wired or wireless communication (e.g., communication through one or more antennas 458). Display 452 can include a liquid crystal display (LCD), a touchscreen (e.g., capacitive or resistive touchscreen), or another type of display. Pointing device 456 can include a mouse, a stylus, or another type of pointing device.

FIG. 4 shows the components of system 400 arranged separated from each other as an example. In some arrangements, two or more components of system 400 can be located on the same die (e.g., same IC chip).

Figure 5:
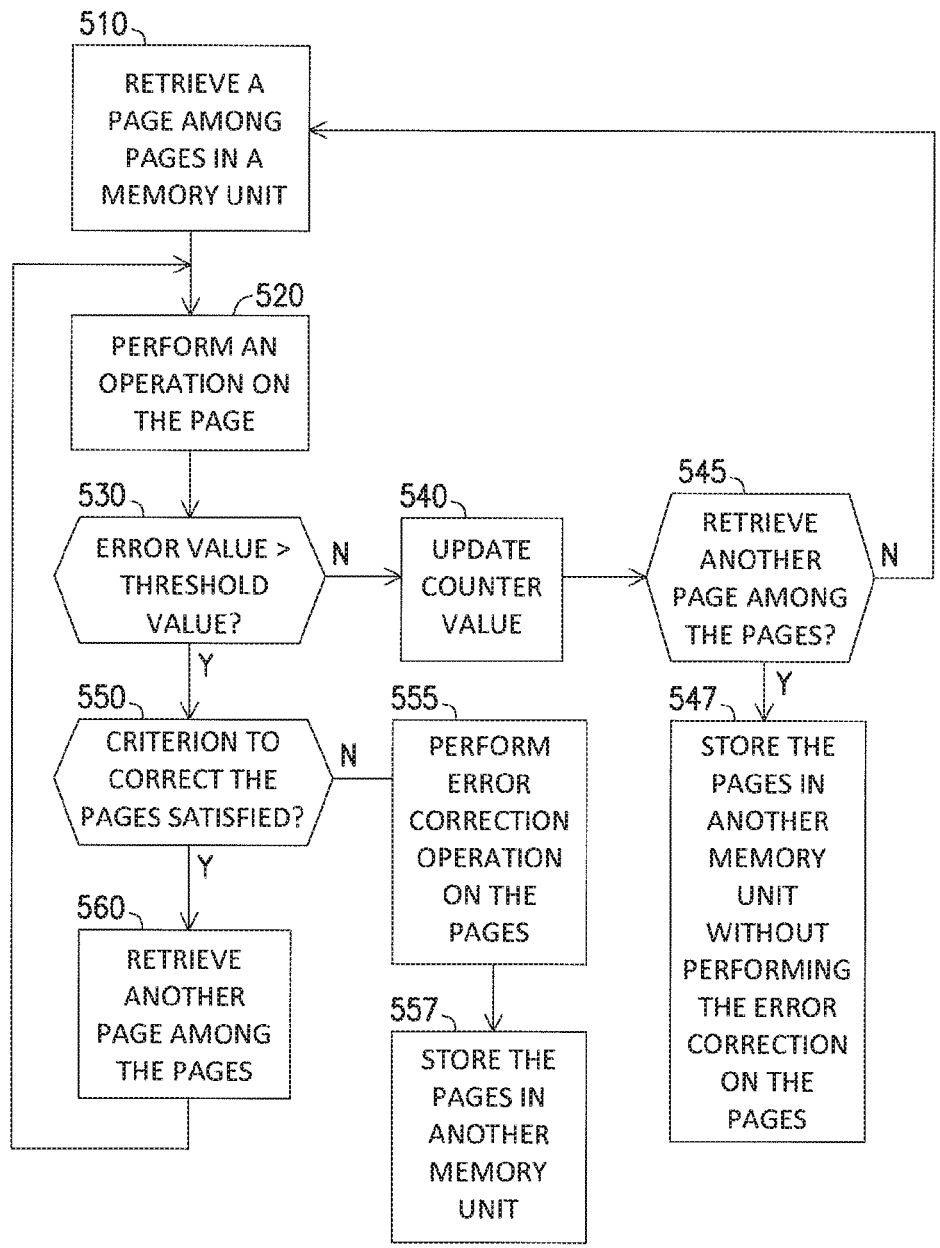
FIG. 5 is a flow diagram showing a method of moving information in a memory module, according to some embodiments described herein.

FIG. 5 is a flow diagram showing a method 500 of moving information in a memory module, according to some embodiments described herein. Method 500 can be part of an algorithm to move information in the memory module and can be performed by the memory module, which can include memory module 101 or 401 described above with reference to FIG. 1 through FIG. 4. Some or all of the activities in method 500 can be implemented by software, firmware, hardware, or any combination of software, firmware, and hardware.

As shown in FIG. 5, activity 510 of method 500 can include retrieving a page (e.g., page.0) from a memory unit (e.g., a memory block) in a memory device of the memory module. The page can be among a number of pages (e.g., page.0 through page.n) of information already stored in memory unit. The pages in method 500 can correspond to information 231.0, 231.1, 231.$n$−1, and 231.$n$ of FIG. 2A.

In FIG. 5, activity 520 can include performing an operation on the page retrieved in activity 510. The operation in activity 520 can include an error detect operation to determine whether the page has an error. Activity 530 can include determining whether an error value of the error is greater than a threshold value. The error value can include a number (quantity) of erroneous bits in the page. Activity 530 can include comparing the number of erroneous bits in the page with the threshold value. Based on the comparison, activity 530 provides a result. The result can have one value to indicate that the number of erroneous bits is not greater than (e.g., less than or equal to) the threshold value (e.g., a pre-determined threshold condition is met). In this case, method 500 can continue with activity 540. The result can have another indication (e.g., another value) to indicate that the number of erroneous bits is greater than the threshold value (e.g., a pre-determined threshold condition is not met). In this case, method 500 can continue with activity 550. If no error is detected in the page in activity 520, the result from activity 520 can also have the value that indicates that the number of erroneous bits is not greater than (e.g., less than or equal to) the threshold value. In this case, method 500 can also continue with activity 540.

Activity 550 can include determining whether a criterion to correct information in the entire memory is satisfied. The criterion can be based on whether enough number of pages in the memory unit have gone through the operation (e.g., error detection operation) in activity 520.

If the criterion in activity 550 is satisfied, method 500 can continue with activity 555 to correct information in the entire memory unit before storing the information in another (e.g., new) memory unit. Activity 555 can include performing an error correction operation to correct errors in the pages in the entire memory unit. Then, method 500 can continue with activity 557 to store the pages (e.g., corrected pages) in another memory unit (e.g., a new memory unit) after the errors in the pages are corrected.

If the criterion in activity 550 is not satisfied, then method 500 can continue with activity 560. As an example, the criterion is not satisfied if there are not enough pages in the memory unit have gone through the operation (e.g., error detection operation) in activity 520. Activity 560 can include retrieving another page (e.g., page.n) among the pages in the memory unit. Method 500 can repeat activity 520 and at least one of other activities of method 500.

As described above, method 500 can perform activity 540 if the result of the operation in activity 520 indicates that the number of erroneous bits is greater than the threshold value or if no error is detected in the page in activity 520. Activity 540 can include updating (e.g., increasing) a counter value. Method 500 may initially set the counter value to be zero at the beginning of the operation of moving information (e.g., pages) from one memory unit to another memory unit. The counter value indicates the number of pages (e.g., sampled pages) that have been retrieved from the memory unit. The counter value can be used to determine whether a predetermined number of pages (e.g., sampled pages to be checked for error) is reached.

Activity 545 can include determining whether to retrieve another page in addition to the page (or pages) that has (or have) gone through the operation (e.g., error detection operation) in activity 520. For example, if the counter value does not reach a predetermined value, then method 500 can continue to repeat activity 510 to retrieve another page (e.g., page.n) in the memory unit and repeat activity 520 and at least one of the other activities of method 500.

If the counter value reaches a predetermined value, then method 500 can perform activity 547. Activity 547 can include storing the pages in another memory unit without performing an error correction operation on the pages.

The pages that are selected to be retrieved from the memory unit can depend on the usage of the memory unit of the memory device in method 500. For example, the pages selected to be retrieved from the memory unit may be identified as worst-case pages for sampling, such as the oldest page (e.g., page.0) and the last page (e.g., page.n) that was stored in the memory unit. As an example, if the memory unit can store 256 pages in the order from page.0 (first page to be stored) through page.255 (last page to be stored), then the oldest page in this example is page.0, and the last page (e.g., newest) in this example is page.255.

In method 500, only two pages (e.g., the oldest page and the last page) may be selected to be checked (e.g., sampled) for error (to go through the error detection operation in activity 520) in order to determine whether pages in the entire memory unit are to be checked for errors (and correct the errors) before moving the pages to another memory unit. Alternatively, more than two pages can be selected for sampling. The number of pages to be selected for the sampling can be programmable and can be based on the memory unit (block) architecture and page characteristics of the memory device.

Method 500 can include additional activities described above with reference to FIG. 1 through FIG. 4, such as activities and operations of memory module 101 or 401.

The illustrations of the apparatuses (e.g., memory module 101 and system 400) and methods (e.g., method 500 operations performed by memory module 101 and system 400) are intended to provide a general understanding of the structure of various embodiments and are not intended to provide a complete description of all the elements and features of an apparatus that might make use of the structures described herein.

The apparatuses (e.g., memory module 101 and system 400) described above can include or be included in high-speed computers, communication and signal processing circuitry, single- or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 4, include apparatuses and methods using a first memory area and a second memory area in a memory device, and using control circuitry included in the memory device to communicate with a memory controller. The memory controller includes an error correction engine. The control circuitry of the memory device is configured to retrieve the first information from the first memory area and store in the first information after the error correction engine performs an error detection operation on the first information, as described above. The control circuitry is configured to retrieve second information from the first memory area and store the second information in the second memory area without an additional error detection operation performed on the second information if a result from the error detection operation performed by the error correction engine on the first information meets a threshold condition. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. A method comprising:
   retrieving, using a memory device, first information from a first portion of the memory device;
   storing, using the memory device, the first information in a first additional portion of the memory device after an error detection operation is performed on the first information;
   retrieving, using the memory device, second information from a second portion of the memory device after the error detection operation is performed on the first information; and
   storing, using the memory device, the second information in an additional second portion of the memory device after no error detection operation is performed on the second information based on a result from the error detection operation performed on the first information.

2. The method of claim 1, wherein the result from the error detection Operation performed on the first information indicates whether a threshold condition is met.

3. The method of claim 1, wherein the result from the error detection operation performed on the first information indicates that the first information has no erroneous bits.

4. The method of claim 1, wherein the result from the error detection operation performed on the first information indicates that the first information has a number of erroneous bits, and the number of erroneous bits is not greater than a predetermined number.

5. The method of claim 1, further comprising:
   retrieving third information from a third portion of the memory device; and
   storing the third information in an additional third portion of the memory device after no error detection operation is performed on the third information based on the result from the error detection operation performed on the first information.

6. The method of claim 1, wherein the first portion of the memory device includes first memory cells, the first additional portion of the memory device includes first additional memory cells, each of the first memory cells is configured to store at most one bit of information, and each of the first additional memory cells is configured to store multiple bits of information.

7. The method of claim 6, wherein the second portion of the memory device includes second memory cells, the second additional portion of the memory device includes second additional memory cells, each of the second memory cells is configured to store at most one bit of information, and each of the second additional memory cells is configured to store multiple bits of information.

8. The method of claim 1, wherein the first memory cells and the second memory, cells are included in a same erasable memory block.

9. The method of claim 8, wherein the first additional memory cells and the second additional memory cells are included in an erasable memory block different from the erasable memory block that includes the first memory cells and the second memory cells.

10. The method of claim 1, further comprising:
    storing the first information in the first portion of the memory device before retrieving the first information from the first portion of the memory device; and
    storing the second information in the second memory cells after the first information is stored in the first memory cells and before retrieving the second information from the first portion of the memory device.

11. The method of claim 1, wherein retrieving the first information is performed during a garbage collection operation of the memory device.

12. A method comprising:
    retrieving, using a memory controller, first information from a first memory area of a memory device;
    performing, using the memory controller, an error detection operation on the first information;
    providing the first information to the memory device for storing the first information in a second memory area of the memory device after performing the error detection operation on the first information;
    performing, using the memory controller, no error detection operation on second information stored in the first memory area based on a result from the error detection operation performed on the first information; and
    providing an indication to the memory device for allowing the memory device to retrieve second information from the first memory area and to store the second information in the second memory area.

13. The method of claim 12, wherein the result from the error detection operation performed on the first information indicates that the first information has no erroneous bits.

14. The method of claim 12, wherein the result from the error detection operation performed on the first information indicates that the first information has a number of erroneous bits, and the number of erroneous bits is not greater than a predetermined number.

15. The method of claim 12, further comprising:
    performing an error correction operation on the first information after retrieving the first information and before providing the first information to the memory device.

16. The method of claim 12, wherein retrieving the first information is performed without receiving a command from a host to retrieve the first information.

17. A method comprising:
    retrieving at a memory controller first information from a memory device coupled to the memory controller;
    performing at the memory controller an error detection operation on the first information;
    providing the first information from the memory controller to the memory device;
    storing the first information in the memory device;
    retrieving at the memory controller second information from the memory device;
    skipping performing an additional error detection operation on the second information based on a result of the operation performed on the first information;
    providing the second information from the memory controller to the memory device; and
    storing the second information in the memory device.

18. The method of claim 17, wherein the memory controller is located on a die and the memory device is located on the die.

19. The method of claim 17, wherein the memory controller is located on a first die and the memory device is located on a second die.

20. The method of claim 17, wherein the memory controller and the memory device are included in a solid state drive.

\* \* \* \* \*